United States Patent [19]

Takasugi et al.

[11] 4,347,964
[45] Sep. 7, 1982

[54] WIRE BONDING APPARATUS

[75] Inventors: Nobuhiro Takasugi, Hinodemachi; Ryuichi Kyomasu, Kodaira, both of Japan

[73] Assignee: Hitachi, Ltd., Tokyo, Japan

[21] Appl. No.: 149,633

[22] Filed: May 14, 1980

[30] Foreign Application Priority Data

May 23, 1979 [JP] Japan .................. 54-62608

[51] Int. Cl.³ .......................... B23K 28/00
[52] U.S. Cl. ...................... 228/4.5; 228/9
[58] Field of Search ........... 228/102, 103, 4.1, 4.5, 228/9, 12

[56] References Cited

U.S. PATENT DOCUMENTS

| | | | |
|---|---|---|---|
| 3,466,514 | 9/1969 | Brunner et al. | 228/102 |
| 3,581,375 | 6/1971 | Rottmann | 228/102 |
| 3,776,447 | 12/1973 | Adams et al. | 228/4.5 |
| 3,928,749 | 12/1975 | Herrmann | 228/4.5 |
| 4,010,885 | 3/1977 | Keizer | 228/6 A |
| 4,068,371 | 1/1978 | Miller | 228/4.5 |
| 4,239,144 | 12/1980 | Elles et al. | 228/4.5 |

FOREIGN PATENT DOCUMENTS

| | | |
|---|---|---|
| 1274241 | 8/1968 | Fed. Rep. of Germany . |
| 2448843 | 4/1976 | Fed. Rep. of Germany . |
| 2651124 | 5/1977 | Fed. Rep. of Germany . |
| 2630139 | 1/1978 | Fed. Rep. of Germany . |
| 2643809 | 4/1978 | Fed. Rep. of Germany . |
| 1465293 | 2/1977 | United Kingdom . |
| 1470670 | 4/1977 | United Kingdom . |
| 1516840 | 7/1978 | United Kingdom . |

*Primary Examiner*—John McQuade
*Attorney, Agent, or Firm*—Craig and Antonelli

[57] ABSTRACT

In a wire bonding apparatus in which, by identifying recognition marks of a pellet or leads displaced from a reference position in wire-bonding a pellet of a semiconductor device to leads within a field of view of a television camera, the displacements of the bonding positions of the pellet and the lead are corrected and then bonding pads on the pellet are connected to the leads by wires, the field of view is moved from a reference view position in a given moving manner, whereby the recognition marks may be identified rapidly and reliably. This apparatus is well adapted for the wire bonding of a semiconductor device of the DILG sealing type, for example, which is poor in the position accuracy of the bonding position.

7 Claims, 7 Drawing Figures

WIRE BONDING APPARATUS

The present invention relates to a wire bonding apparatus and, more particularly, to a system of moving a field of view of a recognition unit used in the wire bonding apparatus.

As shown in FIG. 1, in a conventional wire bonding apparatus using Pattern recognition, in fabricating a semiconductor device such as an IC, a so-called wire bonding step is included in which electrodes or pads 2 of a circuit element of a semiconductor device pellet 1 and tips of leads 3, extending around the pellet 1, are connected by wires 5 such as, gold wires and aluminum wires, through the wire bonding work. The bonding positions of the pads 2, leads 3, and wires 5 are previously set as reference positions; however, as a practical matter the bonding positions are generally different from the reference positions due to the accuracy of mounting of the pellet 1 and the leads 3. Therefore, it is necessary to correct the position at which bonding is to be carried out by measuring an amount of the displacement of the bonding positions from the reference positions. As one of the measuring methods, it has been proposed to automatically measure the amount of the displacement by a pattern recognition technology using an artificial visual sensing means such as a television camera.

For obtaining the respective positions of the bonding pads 2 on a pellet 1 displaced from the reference positions, one or more recognition marks are placed within a field of view of an industrial television camera (ITV) and an amount of the displacement of the one or more recognition marks from the reference position is automatically recognized thereby enabling a correction of the positions of respective pads 2. This method is similarly applied for the measurement of the displacement of the leads 3. Accordingly, the description will proceed about the measurement of the pellet side alone. In this method, however, the position of the field of view of the ITV camera is fixed. Therefore, when the displacement of the bonding positions is large, this method can not place the recognition mark or marks within the filed of view.

This will be described in more detail referring to FIG. 2, wherein reference numeral 1 designates a pellet; 6 a pellet recognition mark, 7 a reference position of the field of view of the camera; 1' and 6' the displaced positions, i.e. the real positions, of the pellet 1 and the pellet recognition mark; and 8 an origin of the field of view.

In order to recognize the displacement of the bonding position correctly by using the conventional fixed view method, it is necessary to set the accuracy of the mounting of the pellet 1' within a fixed value to prevent the pellet 1' from being out of the field of view. In the case of the resin sealing package device in which the pellet 1' is mounted on a metal frame through Au-Si eutectic alloy, the accuracy of the pellet mounting is controllable relatively easily. However, in the case of the glass sealing package device in which the pellet is mounted on a ceramic through a low melting point glass, it is very difficult to control the pellet mounting accuracy. The difficulty in controlling pellet mounting accuracy is becomes always problematic in attempting to fully automate the wire bonding of the glass sealed element. The control of pellet mounting accuracy is particularly difficult dual-in-line glass (referred to as DILG) sealing devics in which the pellet is mounted on a ceramic substrate through low-melting point glass. Therefore, this always becomes a problem in automating attempting to automate the recognition step in the wire bonding of the DILG sealing device.

With the view of eliminating the abovementioned problems of the prior art, the present invention has an object to provide an wire bonding apparatus allowing a good wire bonding.

To achieve the above object, the present invention is characterized in that when a recognition mark can not be recognized at the reference position of the field of view of a recognition apparatus, the field of view is successively moved in a predetermined manner until the recognition mark is recognized in the field of view. More specifically, in a wire bonding apparatus in which one or more recognition marks in a first bonding group or a second bonding group displaced from the reference positions are recognized by a recognition apparatus such an ITV camera, and an amount of the displacement of the bonding positions is corrected on the basis of the recognition, and finally the first bonding positions and the corresponding second bonding positions are connected by wires. In recognizing the recognition mark within the field of view, the field of view is repetitively moved or displaced from the reference view position until the recognition mark falls within the field of view. For example, the field of view is successively moved from the reference view position to positions which are ½ of a distance of the field of view in the X and Y directions of the same. According to the wire bonding apparatus, when a plurality of recognition marks are used for each of a group of the first bonding positions and a group of second bonding positions, an amount of displacement of the first of the plurality of recognition marks, first recognized from the reference position is used to correct the reference view field of the second and the subsequent recognition marks, whereby the second and the subsequent recognition marks are always within the field of view at the reference view position.

Other objects and features of the present invention will be apparent from the following description taken in connection with the accompanying drawings, in which:

FIG. 3b is a cross sectional view taken along the line IIIb—IIIb in FIG. 3a;

Figure 3A:
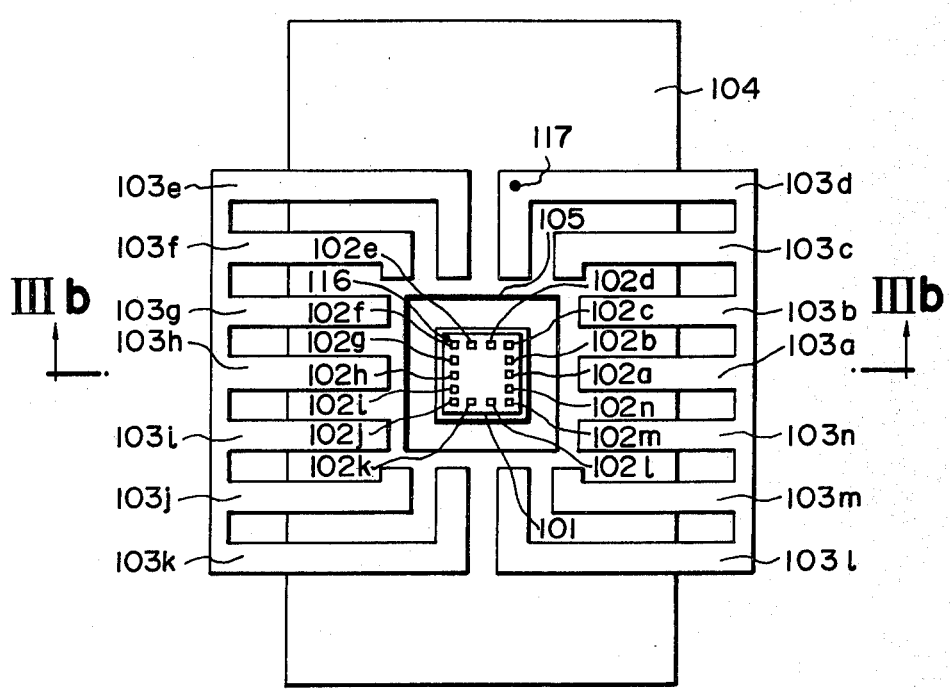
FIG. 3a is a plan view a semiconductor device by the DILG sealing method as an object to be bonded to which the present invention is preferably applicable.
Figure 3B:
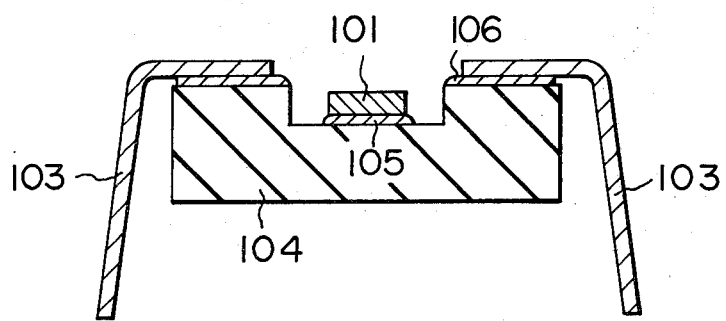

Referring now to the drawings wherein like reference numerals are used throughout the various views to designate like parts and, more particularly, to FIGS. 3a and 3b, according to these figures, a ceramic package body 104 includes a semiconductor device pellet 101 provided with a semiconductor integrated circuit on which fourteen bonding pad electrodes 102a to 102n are arranged. The pellet 101 is bonded on the ceramic package body 104 by means of a low-melting point glass 105 for fixing the pellet 101. Leads 103a to 103n leading to exterior are provided corresponding in number to the fourteen pad electrodes 102a to 102n of the pellet 101. The leads 103a-103n are mounted to the ceramic package body 104 by means of a fixing means such as the low-melting point glass 106. The pellet 101 and the leads 103a-103n are provided with recognition marks 116 and 117, respectively. Any recognition mark such as wirings and the pellet 101 can be adopted since, if they have a clear brightness, the edge thereof is used as a mark. The DILG sealing method uses the low-melting point glass particularly for a fixing agent while high precision is required in positioning the pellet 101 and leads 103a-103n relative to package body 104. This makes it difficult to precisely control a position of the pellet 101 and also the leads 103a-103n. This often brings about a situation that the recognition marks 116, 117 of the pellet 101 and also the leads 103a-103n fails to fall within a field of view of an ITV camera.

Figure 1:
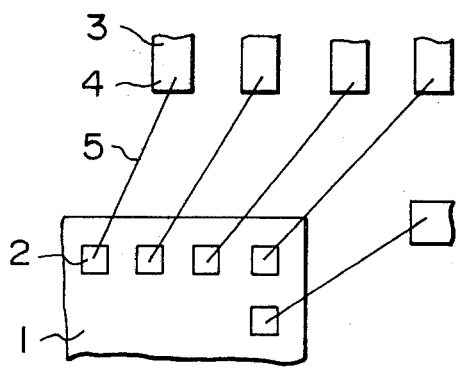
FIG. 1 is a plan view, illustrating a part of an arrangement of a pellet and leads in assembling a semiconductor device.
Figure 2:
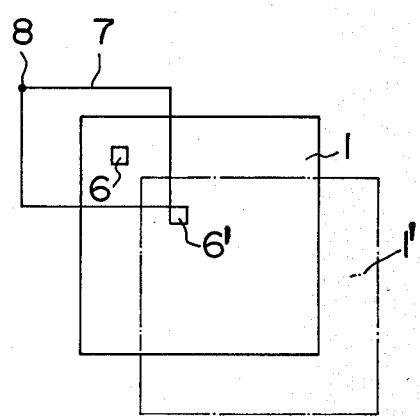
FIG. 2 is a plan view for illustrating a situation wherein a recognition mark can not be recognized when a conventional technique is used for fabricating the semiconductor device.
Figure 4:
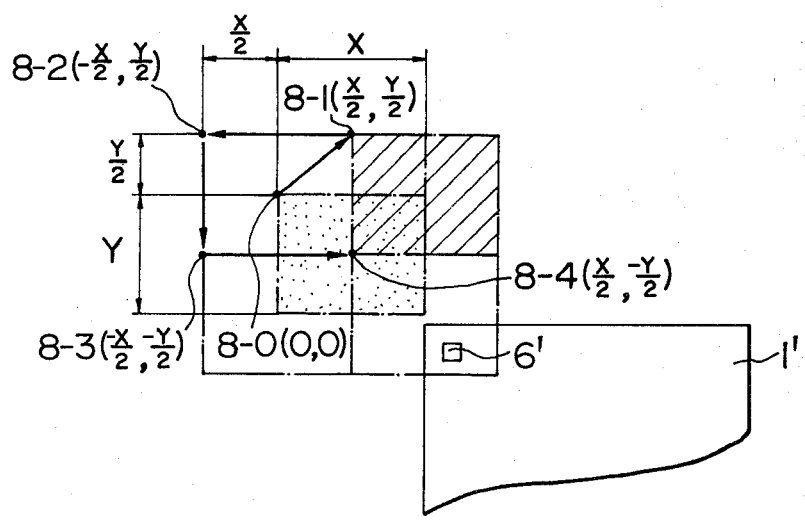
FIGS. 4 and 5 are plan views illustrating examples of a method for moving a field of view according to the invention.

A preferred embodiment of a wire bonding apparatus according to the invention, which is well adapted for the wire bonding of the semiconductor components manufactured by the DILG sealing method, will now be described. A sequence of moving the field of view, i.e., the position of an origin thereof and the associated a range of the view, is illustrated in FIG. 4, with 8-0 being a reference position of the origin of the field of view which corresponds to the origin 8 of the field of view in FIG. 2. In FIG. 4, 8-1 to 8-4 are points located at the positions spaced from the reference position 8-0 by X/2 and Y/2, which represent ½ of the field of the view in X and Y directions, respectively. The movement of the view is performed in the following manner. The origin of the field of view is positioned at the first position 8-0, with the field of view being represented by a dotted area in FIG. 4. Under this condition, if a recognition mark 6' can not be recognized, the view origin is moved to a position 8-1 (X/2, Y/2), so that the field of view moves into an area hatched. If the recognition mark 6' can not be recognized at this position 8-1, the view origin is successively moved to positions, 8-2 (−X/2, Y/2)→8-3 (−X/2, −Y/2)→8-4 (X/2, −Y/2), until recognition the mark 6' is recognized. In the example of FIG. 4, the recognition mark 6' is recognized at the position 8-4. For recognizing the recognition mark 6', the movement of the field of view and the recognition of the recognition mark 6' are repeated in this way. There are many methods to move the field of view and, in embodiment of FIG. 4, the movement of the field of view is repeated a maximum of four times, so that the effective field of view is expanded four times as compared to conventional methods and an allowance of a displacement of the pellet 1' when it is mounted, is doubled. The above-mentioned manner successfully solves the problems of the prior art, and realizes a fully automatic wire bonding apparatus for the semiconductor component of the DILG sealing method.

For measuring a displacement of one bonding position group, for example, pads, a plurality of recognition marks, not single, are often used for enhancing the positional accuracy. In this case, a plurality of reference positions of the field of view are required for the respective marks. If the recognition mark can not be recognized at a reference position, the view moving method like that of a single recognition mark is employed for each recognition mark regardless of the preceeding positional correction, (4× the number of the recognition marks) times of the view movements may be necessary for all the recognitions of the marks. Thus, a long time must be taken for such recognition. This problem was solved by the present invention. When a plurality of recognition marks are used, an amount of displacement of the recognition mark first recognized from the reference position is used to correct the reference positions of the second and subsequent recognition marks. As a result, the second and the subsequent recognition mark are surely within the field of view at the corresponding reference positions, respectively.

Figure 5:
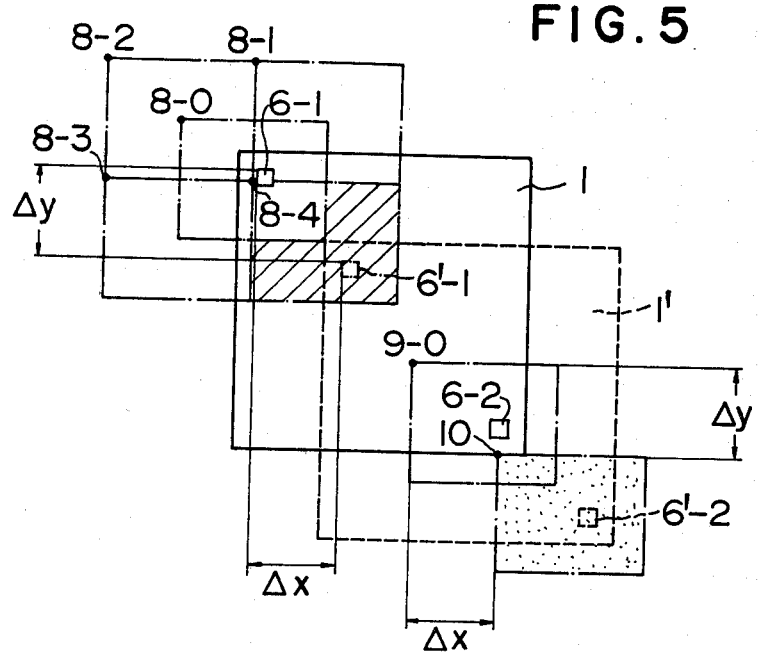

An example using two recognition marks, as en embodiment of the invention, will be described in connection with FIG. 5 wherein a pellet 1, positioned at the reference position, has previously set view reference positions (origin); one 8-0 for a first recognition mark 6-1 and the other 9-0 for a second recognition mark 6-2. For measuring a displacement of an actual pellet, i.e. a displaced pellet 1', the field of view advances to the reference position 8-0 for recognizing a first recognition mark 6'-1. Since the mark 6'-1 is not recognized within the field of view, the field of view is successively moved through a route 8-0→8-1→8-2→8-3→8-4 in the above-mentioned moving manner. At the reference position 8-4, the mark is recognized within the field of view, represented by the cross-hatched area in FIG. 5, at the position 8-4. Following the recognition of the recognition mark 6'-1, the field of view is moved for recognizing the second recognition mark 6'-2. In this case, the field of view is moved not to the previously set reference position 9-0 but to a field of view represented by the dotted area in FIG. 5 at a new reference position 10 corrected by X and Y directional displacements Δx and Δy from the reference position 6-1 of the first recognition mark 6'-1. In this way, the second recognition mark 6'-2 is surely recognized in the first set field of view. Accordingly, there is no need for the successive movements of the field of view, which are needed for the first recognition mark 6'-1, so that time for the all the recognitions of the marks is shortened. This operation is correspondingly applicable for the case using three or more recognition marks.

Figure 6:
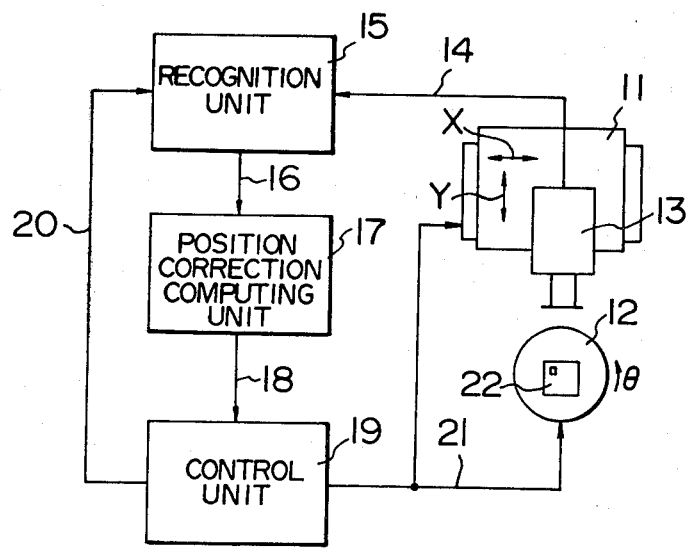
FIG. 6 is a block diagram of a view control system for a fully automated wire bonder in which the present invention is incorporated.

FIG. 6 provides an example of a control system for a fully automated ultrasonic wire bonding apparatus with the view moving system according to the invention and, according to this figure, an X and Y directional table 11 is provided for moving the field of view of a video camera 13, with a θ directional rotary table 12 being provided for rotating a semiconductor device 22. A sequence of controls will be described by way of example. A table control unit 19 controls the X, Y directional table and θ directional rotary table 12 so as to move the field of view in the X, Y θ directions to reference position previously set. Then, in response to a recognition command 20, a recognition unit 15 electrically recognizes a video signal 14 from the video camera 13 to recognize the mark. The result of the recognition denoted as 16 is corrected by a position correction computing unit 17 which, in turn, provides a feed back signal 18 representing the result of computation to the table control unit 19. The control unit 19 judges the result of feedback signal 18 applied to further repeat the table movement and the mark recognition or to complete the recognition task.

The present invention is not limited to the abovementioned embodiments but applicable for other suitable view movements and view movement ranges.

As described above, the present invention is very effective when applied for the position detection of a pellet or leads in wire bonding the semiconductor device by the DILG sealing method. It is evident that the present invention is applicable to semiconductor devices manufactured by other sealing methods.

What is claimed is:

1. A wire bonding apparatus for wire bonding a first group of bonding positions disposed on a first member with a second group of associated bonding positions disposed on a second member, one of said first and second members having at least one recognition mark, the apparatus comprising:
   a recognition means having a field of view for detecting a presence of the recognition mark in the field of view and for identifying a position of the detected recognition mark in the field of view;
   means for successively moving the field of view of said recognition means in a predetermined manner when the recognition mark is not detected until such time the recognition mark falls within the field of view; and
   means for computing the positions of said bonding positions based on a detected position of the recognition mark.

2. A wire bonding apparatus according to claim 1, wherein said means for moving the field of view successively moves the field of view to locations which are spaced by a predetermined portion of a size of the field of view.

3. A wire bonding apparatus according to claim 1, wherein said predetermined portion is one-half of a width of the field of view in an x direction and one-half of a width of the field of view in a y direction.

4. A wire bonding apparatus according to claim 1, wherein at least two recognition marks are provided, and wherein the apparatus further includes means for correcting a manner of moving the field of view for enabling a detection of the second recognition mark after a detection of the first recognition mark has been completed in dependence upon a detected result of the first recognition mark.

5. A wire bonding apparatus for automatically wire bonding semiconductor devices loaded on a movable table, the apparatus comprising:
   an opto-electrical camera means having a field of view for viewing a recognition mark on a semiconductor device;
   a recogntion means for detecting and recognizing a location of an image captured in the field of view of the camera means;
   position correction computing means for computing a location of the image in dependence upon a result of recognition supplied from said recognition means; and
   control means for judging a result of a computation supplied from the position correction computing means and for at least one of moving the field of view of the camera means to a predetermined position when a recognition mark is not detected in the field of view and controlling the bonding apparatus to achieve a wire bonding.

6. A wire bonding apparatus according to claim 5, wherein said control means moves the field of view successively in a predetermined manner when a recognition mark is not detected in the field of view.

7. A wire bonding apparatus according to claim 6, wherein the semiconductor device includes at least two recognition marks which are disposed at relatively fixed positions, and wherein said control means, after a first of the recognition marks has been detected, is adapted to move the field of view in dependence upon the result of the detection of the first recognition mark.

* * * * *